(12) United States Patent
Wang

(10) Patent No.: US 12,733,192 B2
(45) Date of Patent: Sep. 8, 2026

(54) SEMICONDUCTOR DEVICE AND METHOD FOR MANUFACTURING THE SAME

(71) Applicant: Silergy Semiconductor Technology (Hangzhou) LTD, Hangzhou (CN)

(72) Inventor: Huan Wang, Hangzhou (CN)

(73) Assignee: Silergy Semiconductor Technology (Hangzhou) LTD., Hangzhou (CN)

( * ) Notice: Subject to any disclaimer, the term of this patent is extended or adjusted under 35 U.S.C. 154(b) by 474 days.

(21) Appl. No.: 18/118,257

(22) Filed: Mar. 7, 2023

(65) Prior Publication Data

US 2023/0307526 A1 Sep. 28, 2023

(30) Foreign Application Priority Data

Mar. 22, 2022 (CN) ........................ 202210288210.X

(51) Int. Cl.

| | |
|---|---|
| ***H10D 30/01*** | (2025.01) |
| ***H10D 30/65*** | (2025.01) |
| ***H10D 62/10*** | (2025.01) |
| ***H10P 30/20*** | (2026.01) |
| ***H10W 10/00*** | (2026.01) |
| ***H10W 10/17*** | (2026.01) |

(52) U.S. Cl.

CPC ......... *H10D 30/0281* (2025.01); *H10D 30/65* (2025.01); *H10D 62/116* (2025.01); *H10P 30/204* (2026.01); *H10P 30/21* (2026.01); *H10W 10/0147* (2026.01); *H10W 10/17* (2026.01)

(58) Field of Classification Search

CPC ........... H10D 30/0221; H10D 30/0281; H10D 30/603; H10D 30/65; H10D 64/683; H10W 10/0147; H10W 10/17; H10P 14/63

See application file for complete search history.

(56) References Cited

U.S. PATENT DOCUMENTS

| | | | | |
|---|---|---|---|---|
| 8,716,795 | B2 | 5/2014 | You | |
| 8,912,600 | B2 | 12/2014 | You | |
| 10,985,052 | B2 | 4/2021 | Wang | |
| 11,133,413 | B2 | 9/2021 | Han | |
| 11,251,276 | B2 | 2/2022 | Wang et al. | |
| 2015/0187937 | A1* | 7/2015 | Sridhar | H01L 21/76224 257/408 |
| 2016/0005640 | A1* | 1/2016 | Shinohara | H10D 62/116 438/425 |
| 2020/0006529 | A1* | 1/2020 | Qi | H01L 21/02274 |
| 2020/0258987 | A1* | 8/2020 | Chuang | H01L 21/3085 |
| 2021/0217878 | A1* | 7/2021 | Wang | H10D 30/0281 |
| 2021/0320203 | A1* | 10/2021 | Li | H01L 21/76229 |

FOREIGN PATENT DOCUMENTS

| | | | |
|---|---|---|---|
| CN | 103258842 | A * | 8/2013 |
| CN | 104347470 | A | 2/2015 |
| CN | 111769160 | A | 10/2020 |

* cited by examiner

*Primary Examiner* — Fazli Erdem

(57) ABSTRACT

A method of making a semiconductor device can include: etching a substrate to form a trench in the substrate; forming a liner oxide layer on side surfaces and a process bottom portion of the trench through an oxide layer formation method; and where an oxidation time of a junction between an upper surface of the semiconductor substrate and side walls of the trench is increased by the oxide layer formation process, in order to smoothen the junction.

18 Claims, 7 Drawing Sheets

SEMICONDUCTOR DEVICE AND METHOD FOR MANUFACTURING THE SAME

RELATED APPLICATIONS

This application claims the benefit of Chinese Patent Application No. 202210288210.X, filed on Mar. 22, 2022, which is incorporated herein by reference in its entirety.

FIELD OF THE INVENTION

The present invention generally relates to the field of semiconductor technology, and more particularly to semiconductor devices and methods of manufacturing the semiconductor devices.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads. Power switches can be semiconducting devices, including metal-oxide-semiconductor field-effect transistors (MOSFETs) and insulated gate bipolar transistors (IGBTs), among others. For example, laterally-diffused metal-oxide-semiconductor (LDMOS) devices are widely used in such on-off type regulators.

DETAILED DESCRIPTION

Figure 1:
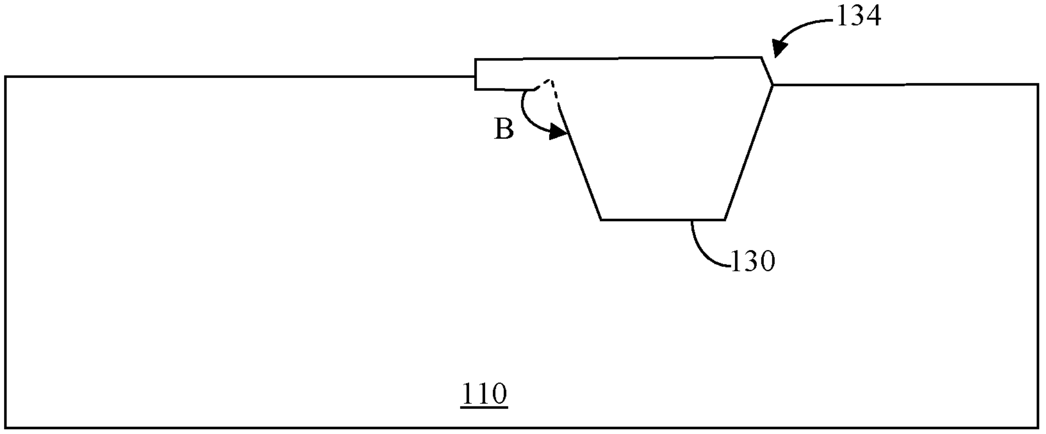
FIG. 1 is a structure diagram of an example LDMOS device.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that can include pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

The manufacturing process of semiconductor integrated circuits mainly includes the formation of devices such as transistors in the active region of the surface of the semiconductor substrate. These devices need to be isolated from each other through isolation structures. Both trench isolation structure and field oxide isolation structure are often used to isolate the active region of semiconductor substrate.

In making power devices (e.g., laterally-diffused metal-oxide-semiconductor [LDMOS] devices), and particularly using a local oxidation of silicon (LOCOS) process to form the field oxide layer, there are a number of different devices/designs on the junction between the high-voltage field oxide isolation structure and the shallow trench isolation structure (STI).

Because of the particularity of the LOCOS process, as shown in the example of FIG. 1, it is relatively easy to form upward sharp corner B at the junction. After the full process is completed, charge accumulation can formed at sharp corner B of the junction, which may reduce the actual thickness of the field oxide layer between the substrate and the polysilicon layer. This can result in the breakdown of the field oxide layer at the junction, and reduced reliability of the field oxide layer. Thus in particular embodiments, the sharp corner at the junction of the upper surface of the semiconductor substrate and sidewalls of the STI trench can be substantially eliminated, in order to improve the performance of the semiconductor device.

Figure 2:
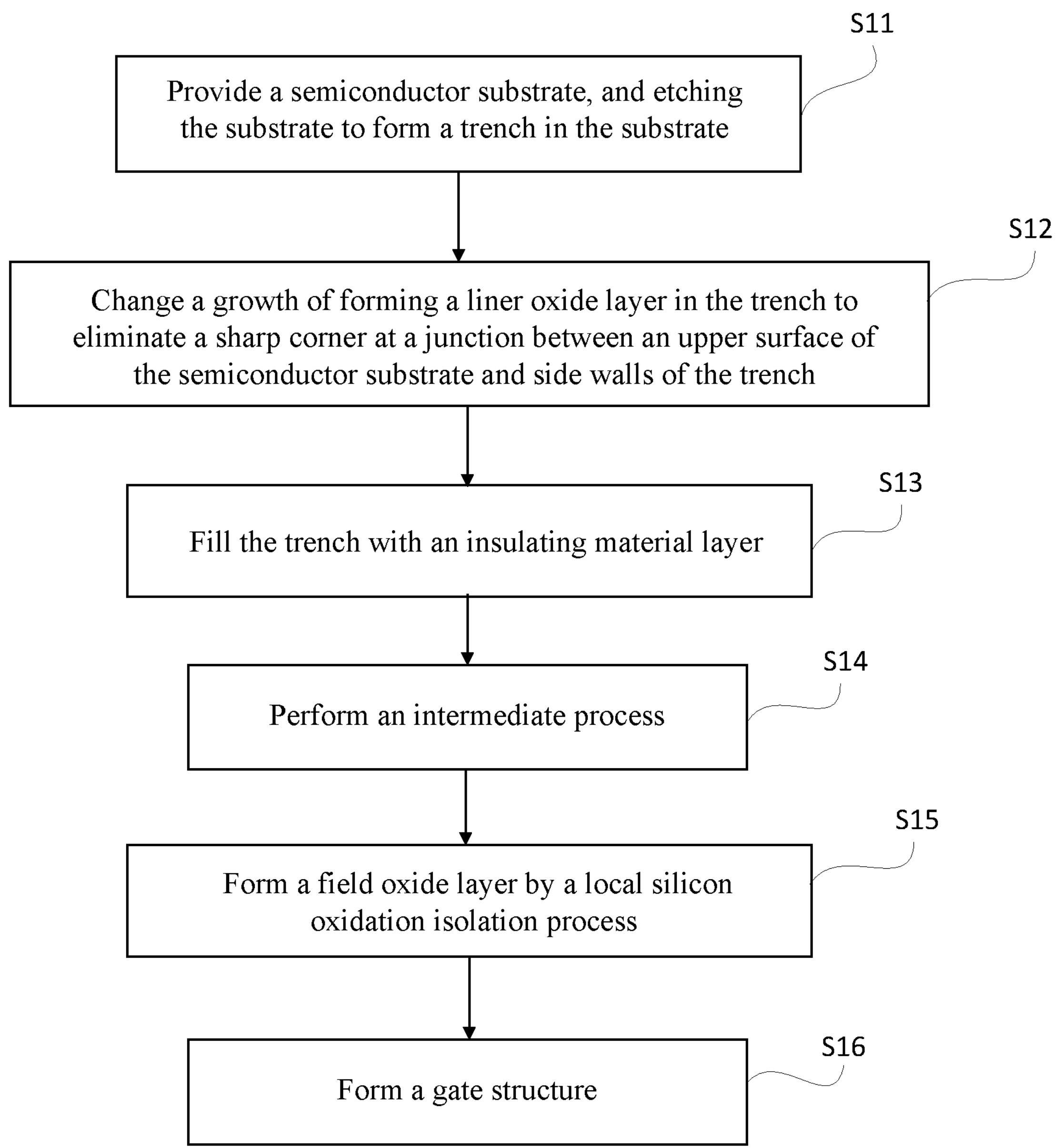
FIG. 2 is a flow diagram of an example manufacturing method of the semiconductor device, in accordance with embodiments of the present invention.

Referring now to FIG. 2, shown is a flow diagram of an example manufacturing method of the semiconductor device, in accordance with embodiments of the present invention. Referring also to FIGS. 3A to 3H, shown are structural diagrams of example steps of a manufacturing method of the semiconductor device, in accordance with embodiments of the present invention.

Figure 3A:
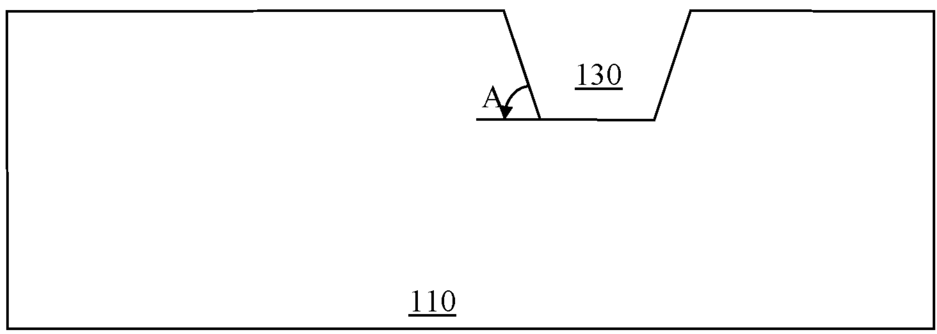
FIGS. 3A to 3H are structural diagrams of example steps of a manufacturing method of the semiconductor device, in accordance with embodiments of the present invention.

As shown in S11 of FIG. 2, and also referring to FIG. 3A, a semiconductor substrate may be provided an etched to form trench 130 in the substrate, that is, the trench is formed at a shallow trench isolation area. For example, side walls of the trench may incline outward, and inclination angle A can be less than or equal to 90 degrees. for example, the cross section of the trench can be an inverted trapezoid, and inclination angle A of the side wall is from 65 degrees to 70 degrees. If inclination angle A is too large, an oxidation rate of the trench side walls in S12 and S13 can be reduced.

As shown in S12 of FIG. 2, the growth step of forming a liner oxide layer in the trench can be changed to eliminate the sharp corner at the junction between the upper surface of the semiconductor substrate and the side walls of the trench. Forming the liner oxide layer on the side surfaces and bottom portion of the trench can be formed through an oxide layer formation method, where an oxidation time of the junction between an upper surface of the semiconductor substrate and side walls of the trench may be increased by the oxide layer formation method, in order to smoothen the junction.

Figure 3B:
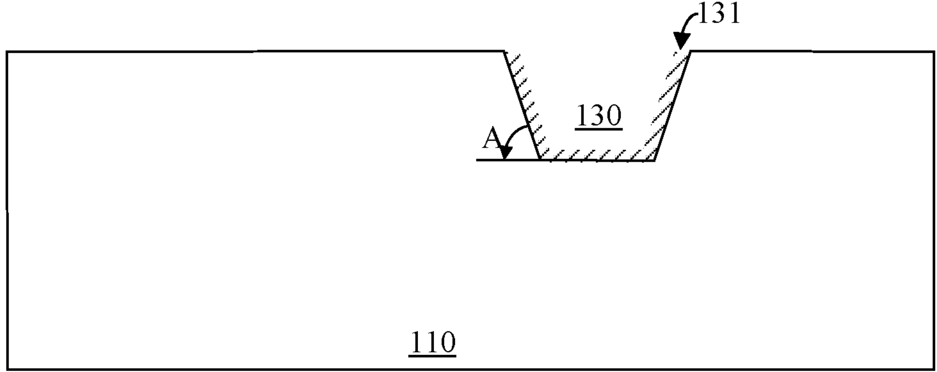
Figure 3C:
Figure 3C:
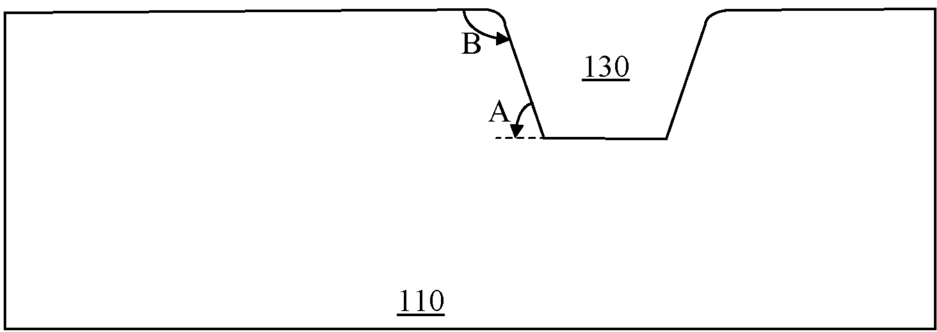
Figure 3D:
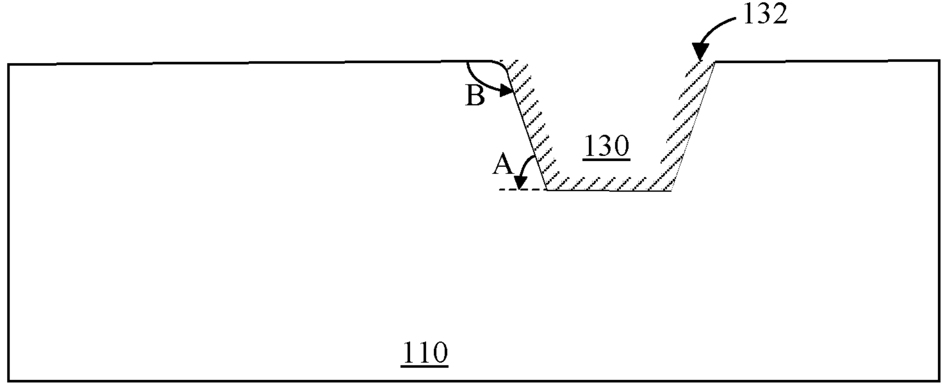

In one embodiment, in S12 of FIG. 2, and also with reference to FIGS. 3B, 3C, and 3D, liner oxide layer 131 can be formed by a first oxidation process, and liner oxide layer 132 may be formed by a second oxidation process. As shown in FIG. 3B, first liner oxide layer 131 may be formed in the trench. After first liner oxide layer 131 is formed, as shown in FIG. 3C, first liner oxide layer 131 can be removed by wet etching process. As shown in FIG. 3D, after first liner oxide layer 131 is removed, second liner oxide layer 132 can be formed in the trench, and a thickness of second liner oxide layer 132 may be greater than or equal to a thickness of first liner oxide layer 131.

As shown in FIGS. 3B and 3D, since first liner oxide layer 131 and second liner oxide layer 132 both cover the side walls of the trench and the upper surface of the semiconductor substrate, the oxidation rate of sharp angle B at the junction between the upper surface of the semiconductor substrate and the side walls of the trench can be faster and sharp angle B is oxidized twice. Thus, sharp angle B may become more smooth and there may be no charge accumulation at sharp corner B. Also, the breakdown voltage of semiconductor devices and the reliability of gate oxide layer can accordingly be improved. As one particular example, the thickness of first liner oxide layer 131 is about 100 Å, the thickness of second liner oxide layer 132 is about 300 Å, and the temperature of growing first liner oxide layer 131 and second liner oxide layer 132 is about 1100° C. The opening of the trench may become larger after first liner oxide layer 131 is grown and removed by a wet etching process. In order to reduce the impact on the opening of the trench, the thickness of first liner oxide layer 131 may not be too large, and the thickness of first liner oxide layer 131 can be less than or equal to the thickness of second oxide layer 132.

In another example, in S12 of FIG. 2, only one liner oxidation may be performed, but the oxidation time can be longer than the time for the first oxidation process or the second oxidation process in the example above. Also, the liner oxide layer can cover the side walls of the trench and the surface of the substrate, such that the deposition thickness of the liner oxide layer is greater than the thickness of first liner oxide layer 131 or the thickness of second liner oxide layer 132, and is approximate to the sum of the thickness of first oxide layer 131 and second oxide layer 132 in first example above, such that sharp angle B can be approximately as smooth as that in that example through one linear oxidation.

It should be noted that in the first example above, the number of liner oxidation can be increased (e.g., three times, four times, etc.), and the previous oxide layer can be removed before depositing the next oxide layer. That is, except for the last liner oxidation, the oxide layer can be removed by a wet etching process after the previous oxide layers are grown, and the thickness of the previous oxide layers should not be too thick. Similarly, in the second example, the time of liner oxidation can be increased so that the oxidation time is greater than the time of the first or second oxidation process in the first example (e.g., three or four times the time of the first oxidation process in the first example). But at this time, it may be necessary to balance the effect of furnace tube on the ion doping implantation of S14 of FIG. 2, because after the ion implantation, if there is a relatively high temperature, the ions can undergo a second distribution, which may form a different concentration distribution than expected, and may affect the performance of semiconductor devices, such as by causing a threshold voltage shift. The liner oxide layer formed in S12 can also repair damage to the substrate caused by etching the semiconductor substrate at the time of forming the trench in S11.

Figure 3E:
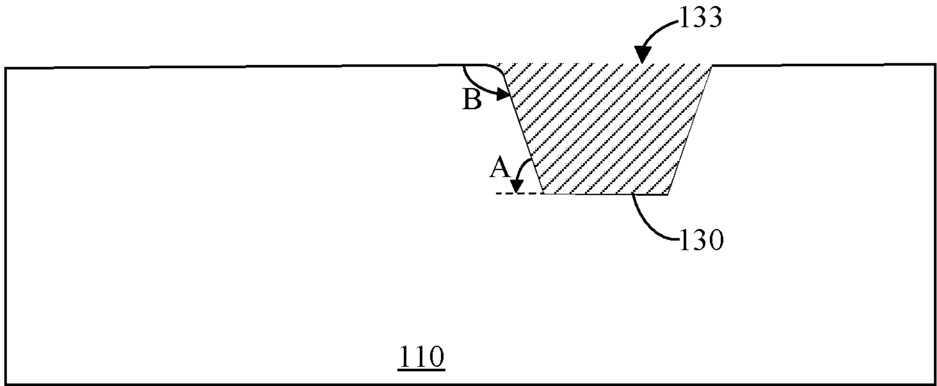

As shown in S13, and referring also to FIG. 3E, the trench can be filled with insulating material layer 133. As shown in FIG. 3E, the filling of insulating material layer 133 may have a great impact on transistor performance, and it is desirable to obtain a gapless filling effect without damaging the substrate structure.

Figure 3F:
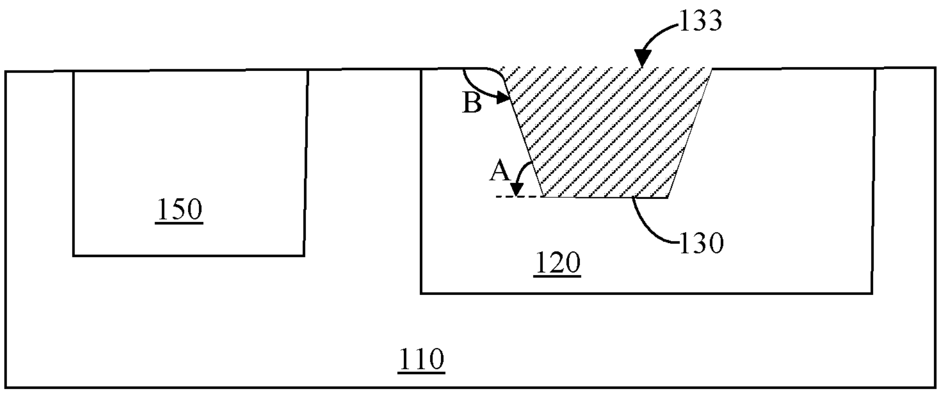

As shown in S14, and referring also to FIG. 3F, an intermediate process can be performed, and may include forming body region 150 and drift region 120 in the semiconductor substrate through processes, such as an ion implantation process. Take N-type LDMOS as an example, the semiconductor substrate (e.g., silicon substrate, gallium substrate, etc.) is P-type substrate, body region 150 is P-type doped well region, and drift region 120 is N-type deep well region. This step can also include source and drain doping injections to respectively form a source region in body region 150 and a drain region in drift region 120.

Figure 3G:
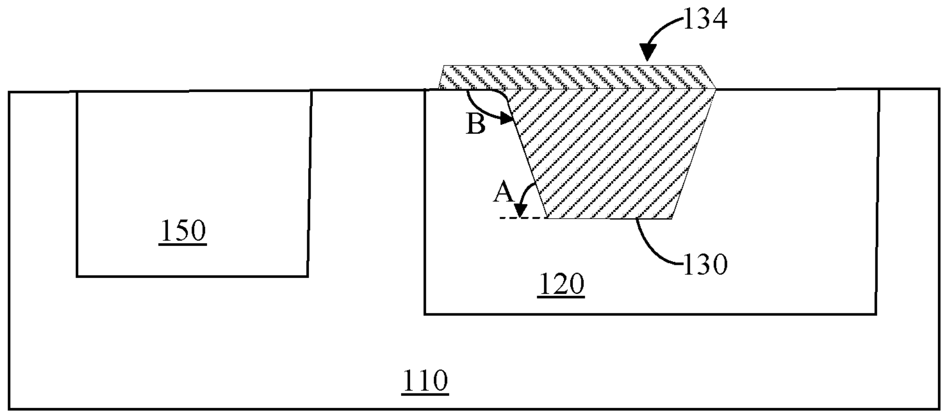

As shown in S15, and referring also to FIG. 3G, field oxide layer 134 can be formed by a local silicon oxidation isolation process. As shown in FIG. 3G, the forming of field oxide layer 134 can include depositing a silicon nitride layer on an upper surface of semiconductor substrate 110 (e.g., including the source region, drain region, drift region, and body region formed in the semiconductor substrate 110) and a top surface of insulating material layer 133, and etching the silicon nitride layer. The window opening area of the etched silicon nitride layer can correspond to the field oxide layer area, and the window opening area may expose the top surface of insulating material layer 133. Using the silicon nitride layer as the mask, field oxide layer 134 structure can be obtained by the LOCOS process, as shown in FIG. 3G. The thickness of field oxide layer 134 can be adjusted according to the withstand voltage of the semiconductor device. As an example, the thickness of field oxide layer 134 can be from 300 Å to 1000 Å, such as 800 Å.

After field oxide layer 134 is formed, the insulating material layer and field oxide layer 134 can be seamlessly connected to form an integration, in order to improve the quality of field oxide layer 134 and the trench isolation structure. In S15, because the angle B becomes smooth in S13, the thickness of field oxide layer 134 can be effectively increased, and the breakdown risk caused by the charge accumulation problem may be reduced.

Figure 3H:
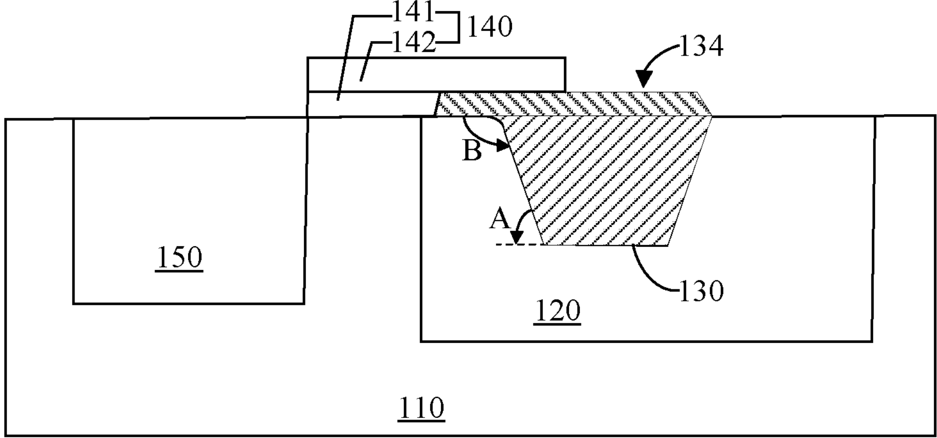

As shown in S16, and referring also to FIG. 3H, gate structure 140 can be formed on a semiconductor substrate having field oxide layer 134 and shallow trench isolation region. In this example, gate structure 140 can include gate oxide layer 141 and polysilicon layer 142 formed on gate oxide layer 141. A height of gate oxide layer 141 may not be higher than the thickness of field oxide layer 134, and polysilicon layer 142 can also partially cover field oxide layer 134.

In S15, a thin oxide layer can also be deposited on semiconductor substrate 110 before the deposition of the silicon nitride layer. The thickness of the thin oxide layer can be consistent with (e.g., the same as) the thickness of gate oxide layer 141. The etched silicon nitride layer may also be covered on gate oxide layer 141. The silicon nitride layer can be used as a mask to increase the thickness of some areas of the thin oxide layer, and the field oxide layer 134 of the target thickness can be obtained. Then, the silicon nitride layer may be removed, and the thin oxide layer can be etched to expose other areas on the upper surface of the semiconductor substrate 110, such as the source region and drain region, in order to subsequently manufacture a source electrode connecting to the source region and a drain electrode connecting to the drain region.

In particular embodiments, the thickness of the liner oxide layer formed by at least twice or only once oxidation processes and in the trench of S12 may be greater than a predetermined thickness. There may be no special restriction on the manufacturing process of LDMOS devices or other layer structures in other semiconductor devices, and it is not limited to applications of high-voltage LDMOS devices, but also to other low-voltage MOS devices. Corresponding to the reliability of the thickness of the field oxide layer with various thicknesses and the design reliability of the breakdown voltage, field oxide layer 134 may not be limited to the high-voltage field oxide layer with high thickness, and can be applied to a field oxide layer or gate oxide layer with any suitable thickness.

Figure 4:
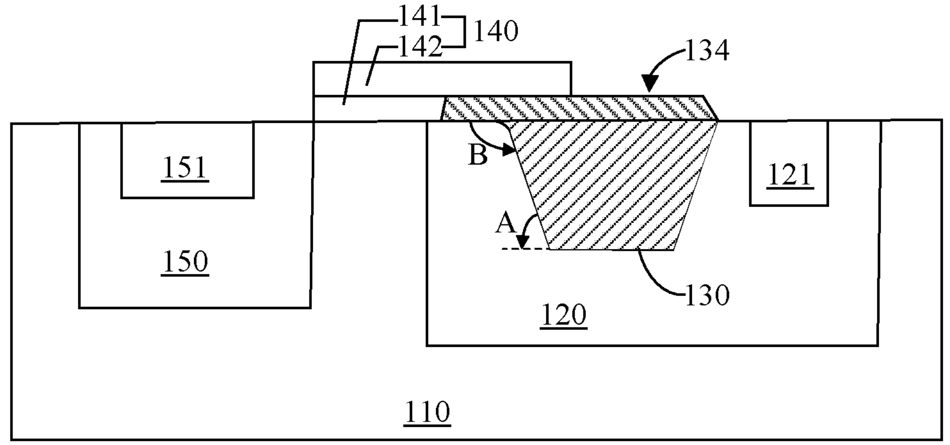
FIG. 4 is a structure diagram of the example semiconductor device, in accordance with embodiments of the present invention.

Referring now to FIG. 4, shown is a structure diagram of the example semiconductor device, in accordance with embodiments of the present invention. The semiconductor device may be provided with body region 150 and drift region 120 in semiconductor substrate 110, doping region 151 in body region 150, drain region 121 in drift region 120, shallow trench isolation region 130 (e.g., the trench structure discussed above) in drift region 120 between drain region 121 and body region 150, field oxide layer 134 on the upper surface of shallow trench isolation region 130, and gate structure 140 arranged from body region 151 to drift region 120. A bottom layer of gate structure 140 may be provided with gate oxide layer 141, an upper layer may be provided with polysilicon layer 142, and polysilicon layer 142 can also cover the junction between field oxide layer 134 and gate oxide layer 141.

In FIG. 4, sharp angle B at the junction between the upper surface of the semiconductor substrate and the side walls of the shallow trench isolation region 130 obtained by particular embodiments is a relatively smooth structure. Also, the thickness of field oxide layer 134 can be guaranteed, and the smooth structure of sharp angle B may not easily accumulate charges, which can further reduce the breakdown risk of field oxide layer 134 and improve the breakdown voltage of the semiconductor device. Taking N-type LDMOS devices as an example, semiconductor substrate 110 of semiconductor device 200 is a P-type substrate, body region 150 is a P-type well region, drift region 120 is an N-type doped well region, source region 151 is N-type doped, and drain region 121 is N-type doped.

A semiconductor device/structure in particular embodiments can be manufactured according to exemplary methods discussed herein. The thickness of the oxide layer formed by at least twice or only once oxidation process and in the trench can be greater than the preset thickness to eliminate sharp corner at the junction between the upper surface of the semiconductor substrate and side walls of the trench, make the sharp corner at the junction between the upper surface of the semiconductor substrate and side walls of the trench become smooth, and reduce the influence of the sharp corner caused by the incomplete oxidation of the boundary structure on the thickness of the field oxide layer. Then, the thickness uniformity of the field oxide layer can be guaranteed, the breakdown protection effect of the field oxide layer may be guaranteed, and the performance of the semiconductor device accordingly improved.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of making a semiconductor device, the method comprising:

a) etching a substrate to form a trench in the substrate, wherein a sharp corner is formed at a junction between an upper surface of the substrate and a side wall of the trench, and wherein an inclination angle of the side wall is from 65 degrees to 70 degrees;

b) forming at least two layers of liner oxide layer on side surfaces and a bottom portion of the trench through an oxide layer formation process, in order to oxidize the sharp corner, wherein a thickness of the liner oxide layer is subsequently reduced;

c) wherein an oxidation time of a junction between an upper surface of the semiconductor substrate and side walls of the trench is increased by the oxide layer formation process, in order to smoothen the junction;

d) filling the trench with an insulating material; and e) forming a field oxide layer on the insulating material and a part of the substrate, wherein a junction formed by the insulating material, the field oxide layer, and the substrate is a smooth transition structure, and wherein the sharp corner is oxidized to disappear.

2. The method of claim 1, wherein a growth time of forming the liner oxide layer is increased in the trench to make the junction between the upper surface of the semiconductor substrate and the side wall of the trench smooth.

3. The method of claim 1, wherein a number of times of forming the liner oxide layer in the trench is increased to make the junction between the upper surface of the semiconductor substrate and the side wall of the trench smooth.

4. The method of claim 3, wherein the forming the liner oxide layer comprises:

a) forming a first oxide layer in the trench to cover the bottom portion and side walls of the trench; and b) forming a second oxide layer on the surface of the first oxide layer.

5. The method of claim 4, wherein the forming the liner oxide layer comprises removing the first oxide layer before forming the second oxide layer.

6. The method of claim 3, wherein the forming liner oxide layer comprises:

a) forming a first oxide layer in the trench to cover the bottom portion of the trench and the side wall of the trench;

b) removing the first oxide layer; and c) forming a second oxide layer on the bottom portion and the side walls of the trench.

7. The method of claim 6, wherein a thickness of the first oxide layer is 100 Å, and a thickness of the second oxide layer is 300 Å.

8. The method of claim 5, further comprising removing the liner oxide layer by a wet etching process.

9. The method of claim 5, wherein when the liner oxide layer is formed by at least two oxidation processes in the trench, a thickness of a last formed oxide layer is greater than or equal to a thickness of any previous formed oxide layer.

10. The method of claim 1, wherein the side walls of the trench are inclined to the outside at the inclination angle that is less than or equal to 90 degrees.

11. The method of claim 1, wherein a section shape of the trench is an inverted trapezoid having the inclination angle from 65 degrees to 70 degrees.

12. The method of claim 1, further comprising:

a) forming a body region and a drift region in the trench by ion doping implantation process; and b) forming a gate structure on the field oxide layer and the substrate.

13. The method of claim 12, further comprising:

a) forming a source region in the body region by an ion doping implantation process; and b) forming a drain region in the drift region by the ion doping implantation process.

14. A semiconductor structure formed by the method of claim 1, the semiconductor structure comprising:

a) the trench formed in the substrate and the insulating material filled in the trench; and b) wherein a corner at a top of the trench where the field oxide layer is connected with the trench is a round corner.

15. The method of claim 1, further comprising forming a gate structure on the field oxide layer and the substrate, wherein the gate structure comprises a gate oxide layer and a polysilicon layer.

16. The method of claim 15, wherein the gate oxide layer is on the substrate, and the polysilicon layer is on the gate oxide layer and the field oxide layer.

17. The method of claim 15, wherein the polysilicon layer fully covers the gate oxide layer, and the polysilicon layer only partially covers the field oxide layer.

18. The method of claim 15, wherein a height of the gate oxide layer is not higher than a thickness of the field oxide layer.

* * * * *